(12) United States Patent
Asakawa

(10) Patent No.: US 8,018,057 B2
(45) Date of Patent: Sep. 13, 2011

(54) SEMICONDUCTOR DEVICE WITH RESIN LAYERS AND WIRINGS AND METHOD FOR MANUFACTURING THE SAME

(75) Inventor: Tatsuhiko Asakawa, Fujimi (JP)

(73) Assignee: Seiko Epson Corporation (JP)

( * ) Notice: Subject to any disclaimer, the term of this patent is extended or adjusted under 35 U.S.C. 154(b) by 457 days.

(21) Appl. No.: 12/034,204

(22) Filed: Feb. 20, 2008

(65) Prior Publication Data

US 2008/0197486 A1 Aug. 21, 2008

(30) Foreign Application Priority Data

Feb. 21, 2007 (JP) ................. 2007-041092

(51) Int. Cl.
- H01L 23/48 (2006.01)
- H01L 23/52 (2006.01)
- H01L 29/40 (2006.01)
- H01L 23/58 (2006.01)
- H01L 23/12 (2006.01)
- H01L 23/053 (2006.01)
- H01L 23/29 (2006.01)

(52) U.S. Cl. ........ 257/734; 642/643; 642/701; 642/759; 642/792

(58) Field of Classification Search .............. 257/642, 257/759, E23.018, E23.075, 667, 737, 780, 257/781, 738, 643, 701, 792
See application file for complete search history.

(56) References Cited

U.S. PATENT DOCUMENTS

| | | | |
|---|---|---|---|
| 5,342,207 A * | 8/1994 | Sobhani .................. 439/74 |
| 6,097,091 A * | 8/2000 | Ohsumi .................. 257/758 |
| 6,255,737 B1 * | 7/2001 | Hashimoto ............. 257/784 |
| 6,287,893 B1 * | 9/2001 | Elenius et al. ........... 438/108 |
| 6,441,500 B1 * | 8/2002 | Sumikawa et al. ...... 257/780 |
| 6,448,647 B1 * | 9/2002 | Kurita et al. ............. 257/738 |
| 6,605,490 B2 * | 8/2003 | Shibata ................... 438/108 |
| 6,707,153 B2 * | 3/2004 | Kuwabara et al. ....... 257/738 |
| 7,009,306 B2 * | 3/2006 | Hanaoka ................. 257/781 |
| 7,235,879 B2 * | 6/2007 | Hashimoto ............. 257/734 |
| 7,408,242 B2 * | 8/2008 | Yamanaka et al. ...... 257/666 |
| 7,462,937 B2 * | 12/2008 | Hanaoka .............. 257/737 |
| 2001/0015496 A1 * | 8/2001 | Watase et al. ........... 257/737 |
| 2001/0045649 A1 * | 11/2001 | Sumikawa et al. ...... 257/738 |
| 2002/0008320 A1 * | 1/2002 | Kuwabara et al. ....... 257/738 |
| 2005/0146056 A1 * | 7/2005 | Shibata ................... 257/787 |
| 2005/0230773 A1 * | 10/2005 | Saito et al. .............. 257/433 |
| 2006/0097373 A1 * | 5/2006 | Ito .......................... 257/679 |

FOREIGN PATENT DOCUMENTS

JP 60121740 A * 6/1985

(Continued)

*Primary Examiner* — Minh-Loan T Tran
*Assistant Examiner* — Teresa M. Arroyo
(74) *Attorney, Agent, or Firm* — Harness, Dickey & Pierce, P.L.C.

(57) ABSTRACT

A semiconductor device includes: a semiconductor substrate that has an integrated circuit and an electrode electrically connected to the integrated circuit; a first resin layer that is formed in a first region overlapping the integrated circuit over a surface of the semiconductor substrate where the electrode is formed; a wiring that is electrically connected to the electrode and is formed on the first resin layer; and a second resin layer that is formed on the surface of the semiconductor substrate in a second region surrounding the first region, is the second resin layer being spaced a distance from the first resin layer.

6 Claims, 5 Drawing Sheets

FOREIGN PATENT DOCUMENTS

| | | | |
|---|---|---|---|
| JP | 02058357 A | * | 2/1990 |
| JP | 03019259 A | * | 1/1991 |
| JP | 04164344 A | * | 6/1992 |
| JP | 2003-203882 | | 7/2003 |
| JP | 2006-032711 | | 2/2006 |
| JP | 2006032711 A | * | 2/2006 |
| JP | 2006-128364 | | 5/2006 |
| JP | 2007-042736 | | 2/2007 |
| JP | 2007-042770 | | 2/2007 |
| JP | 2007-149763 | | 6/2007 |
| JP | 2007149763 A | * | 6/2007 |

\* cited by examiner

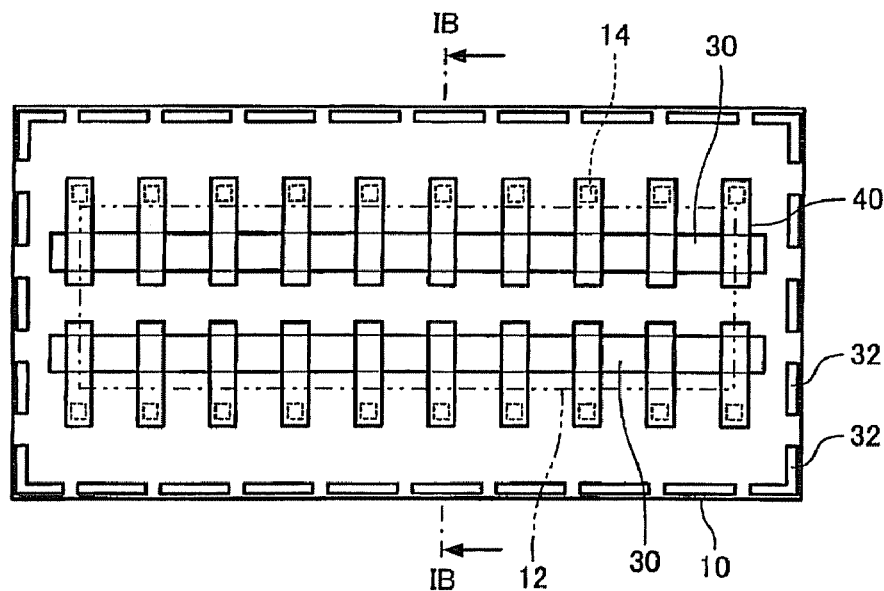
FIG.1A
FIG.1B
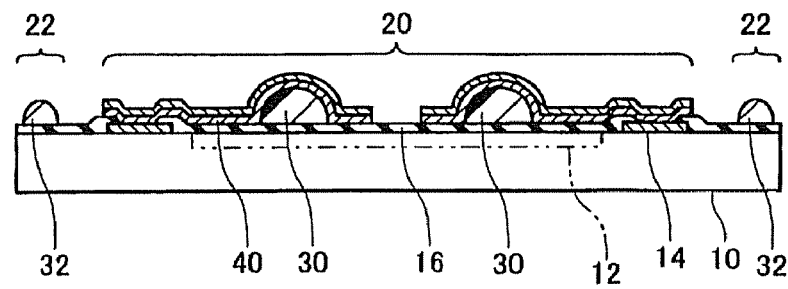
FIG.2
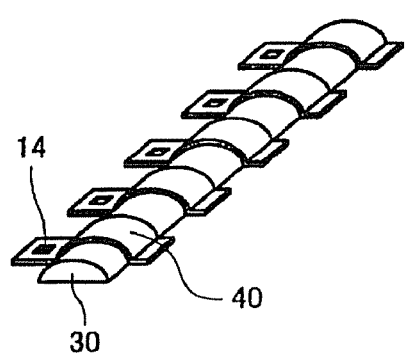

SEMICONDUCTOR DEVICE WITH RESIN LAYERS AND WIRINGS AND METHOD FOR MANUFACTURING THE SAME

The entire disclosure of Japanese Patent Application No. 2007-041092, filed Feb. 21, 2007 is expressly incorporated by reference herein.

BACKGROUND

1. Technical Field

The present invention relates to semiconductor devices and methods for manufacturing the same.

2. Related Art

A known semiconductor device is equipped with a resin layer formed on its active surface and wirings provided in a manner to extend from the surface of its electrode pads to the surface of the resin layer (see, for example, JP-A-2006-128364). The resin layer and the wirings thereon form external terminals. The external terminals may be formed at a narrower pitch than that of external terminals formed with solder balls, and the resin layer is capable of absorbing stress. According to the manufacturing method, the semiconductor wafer is diced after forming the resin layer and wirings. Therefore, if semiconductor chips obtained through dicing have cracks and become defective, the resin layer and the wirings are also wasted, and therefore the manufacturing yield becomes deteriorated. Because of the demand for size-reduction in recent years, scrub lines are often set near integrated circuits, and in this case, cracks would likely reach the integrated circuits. In this respect, measures to prevent generation of cracks are demanded.

SUMMARY

In accordance with an aspect of the present invention, it is possible to prevent generation of cracks in semiconductor substrates having integrated circuits formed thereon.

(1) A semiconductor device in accordance with an embodiment of the invention includes: a semiconductor substrate that has an integrated circuit and an electrode electrically connected to the integrated circuit; a first resin layer that is formed in a first region overlapping the integrated circuit over a surface of the semiconductor substrate where the electrode is formed; a wiring that is electrically connected to the electrode and is formed on the first resin layer; and a second resin layer that is formed on the surface of the semiconductor substrate in a second region surrounding the first region, the second resin layer spaced a distance from the first resin layer.

According to the embodiment of the invention, because the second resin layer is formed in a manner to surround externally the region that overlaps the integrated circuit, generation of cracks can be prevented by the second resin layer outside of the integrated circuit.

(2) In the semiconductor device, the second resin layer may be formed lower than the first resin layer.

(3) In the semiconductor device, the second resin layer may be disposed continuously over the entire second region.

(4) In the semiconductor device, the second resin layer may be fragmentarily disposed.

(5) In the semiconductor device, the second resin layer may be disposed in a manner to contact a periphery of the semiconductor substrate.

(6) In the semiconductor device, the periphery of the semiconductor substrate may be in a rectangular form, and the second resin layer may be disposed at least at corner sections of the rectangular shape.

(7) In the semiconductor device, the wiring may be formed in a manner to extend from the electrodes over the first resin layer, and reach the top surface of the second resin layer.

(8) A method for manufacturing a semiconductor device in accordance with an embodiment of the invention includes: preparing a semiconductor substrate having a plurality of integrated circuits formed at intervals and an electrode electrically connected to the integrated circuits, respectively; forming a first resin layer on a plurality of first regions overlapping the plurality of integrated circuits, respectively, and forming a second resin layer in a second region that surrounds outside the first regions and is spaced a distance from the first resin layer; forming, on the first resin layer, a wiring that electrically connects to the electrodes; and cutting the semiconductor substrate into a plurality of semiconductor chips in a manner that at least a portion of the second resin layer remains to be attached to the second region between adjacent ones of the first regions.

In accordance with the present embodiment, the second resin layer that surrounds outside the region overlapping the integrated circuit is formed, such that generation of cracks can be prevented by the second resin layer outside the integrated circuit.

(9) In the method for manufacturing a semiconductor device, the second resin layer may be formed while avoiding a cut region on the semiconductor substrate to be cut in the cutting of the semiconductor substrate.

(10) In the method for manufacturing a semiconductor device, the cutting of the semiconductor substrate may include cutting a portion of the second resin layer.

(11) In the method for manufacturing a semiconductor device, the cutting of the first resin layer may include forming a thermosetting type first resin precursor layer and heating the first resin precursor layer, and the forming of the second resin layer may include forming a thermosetting type second resin precursor layer and heating the second resin precursor layer, wherein the first and second resin precursor layers are concurrently formed in the same height and in a manner that the second resin precursor layer has a surface area per unit volume greater than a surface area per unit volume of the first resin precursor layer; the first and second resin precursor layers are heated at the same time, thereby causing the amount of heat per unit volume of the second resin precursor layer greater as a result of the greater surface area per unit volume to increase the degree of temporary softening of the second resin precursor layer before hardening, thereby lowering the height of the second resin precursor layer by its dead weight, such that the height of the second resin layer becomes lower than the height of the first resin layer.

(12) In the method for forming a semiconductor device, the forming of the wiring may include forming a plurality of wirings on one of the first resin layers at intervals, and etching portions of the first resin layer between the plurality of the wirings, wherein the etching of portions of the first resin layer may include etching the second resin layer to lower the second resin layer.

BRIEF DESCRIPTION OF THE DRAWINGS

FIG. 1A is a plan view of a semiconductor device in accordance with a first embodiment of the invention, and FIG. 1B is a cross-sectional view of the semiconductor device taken along lines IB-IB shown in FIG. 1A.

FIG. 2 is a perspective view showing a first resin layer and wirings.

DESCRIPTION OF EXEMPLARY EMBODIMENTS

First Embodiment

Figure 3A:
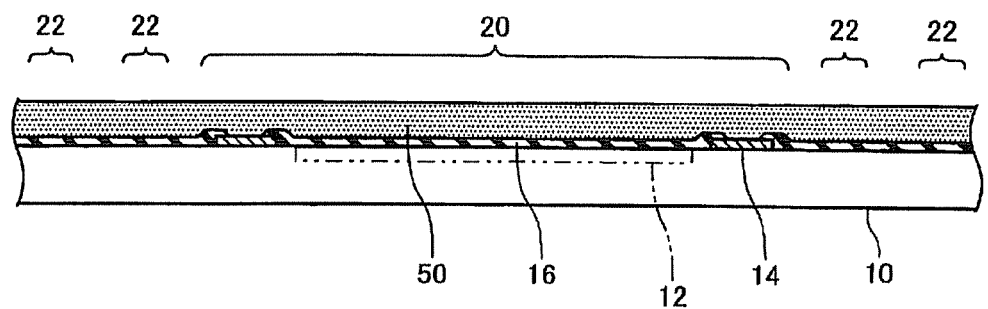
FIGS. 3A-3C are schematic cross-sectional views for describing a method for manufacturing a semiconductor device in accordance with a first embodiment of the invention.

FIG. 1A is a plan view of a semiconductor device in accordance with a first embodiment of the invention, and FIG. 1B is a cross-sectional view of the semiconductor device taken along lines IB-IB shown in FIG. 1A. The semiconductor device includes a semiconductor substrate 10. The semiconductor substrate 10 may be a semiconductor chip if the semiconductor device shown in FIG. 1A is a final product, and may be a semiconductor wafer if it is in a state before completing it as a final product. Semiconductor chips are obtained by cutting the semiconductor wafer. The semiconductor substrate 10 has an integrated circuit 12 (a single integrated circuit 12 in the case of a semiconductor chip, or a plurality of integrated circuits 12 in the case of a semiconductor wafer) formed therein. The semiconductor substrate 10 has electrodes 14 that are electrically connected to the integrated circuit 12 through internal wirings (not shown). The semiconductor substrate 10 has an elongated shape in one direction (having a rectangular plane configuration), and a plurality of the electrodes 14 are arranged along the long sides of the semiconductor substrate 10. A passivation film 16, which exposes at least a potion of the electrodes 14, is formed on the semiconductor substrate 10. The passivation film 16 may be formed only from an inorganic material, such as, $SiO_2$, SiN or the like. The passivation film 16 is formed above the integrated circuit 12.

The surface of the semiconductor substrate 10 on which the electrodes 14 are formed (on the passivation film 16) includes first and second regions 20 and 22 (or may be composed only of the first and second regions). The first region 20 overlaps at least a portion (for example, the entire portion) of the integrated circuit 12. The first region 20 may be a region in the surface of the semiconductor substrate 10 except its peripheral section, and may be its central area. The second region 22 surrounds the first region 20 outside thereof. The second region 22 may be a peripheral section of the surface of the semiconductor substrate 10. The periphery of the second region 22 is the periphery of the surface of the semiconductor substrate 10.

First resin layers 30 are formed in the first region 20 (within the range thereof). The electrodes 14 are formed in the end section of the semiconductor substrate 10, and the first resin layers 30 may be formed in a central area more inside than the electrodes 14. Second resin layers 32 are formed in the second region 22 (in the range thereof), spaced a distance from the first resin layers 30. As the material of the first and second resin layers 30 and 32, for example, polyimide resin, silicon modified polyimide resin, epoxy resin, silicon modified epoxy resin, benzocyclobutene (BCB), polybenzoxazole (PBO), phenol system resin and the like may be used. The first and second resin layers 30 and 32 may be composed of the same material. The second resin layers 32 are formed lower than the first resin layer 30. In one of the second regions 22 (for example, in a region of a rectangular frame shape), a plurality of the second resin layers 32 are disposed fragmentarily (at intervals). Therefore, when mounting the semiconductor device as a finished product, adhesive (nonconductive adhesive or anisotropic conductive adhesive) provided on the surface where the electrodes 14 are formed can be discharged through the gaps between adjacent ones of the second resin layers 32. The second resin layers 32 may be disposed in a manner to contact the periphery of the semiconductor substrate 10, but may be disposed inside the periphery, as shown in FIG. 1A. The periphery of the semiconductor substrate 10 is rectangular, and the second resin layers 32 are disposed at least at its corners.

Wirings 40 electrically connected to the electrodes 14 are formed on the first resin layer 30. FIG. 2 is a perspective view showing the first resin layer 30 and the wirings 40. The wirings 40 extend from the top surface of the electrodes 14, run over the passivation film 16 and reach the top surface of the first resin layer 30. The wirings 40 are electrically connected to the electrodes 14 on the top surface of the electrodes 14. The wirings 40 and the electrodes 14 may be in direct contact with one another, or conductive films 60 (not shown) may be provided between the two. As the second resin layers 32 are formed lower than the first resin layers 30, the second resin layers 32 do not become obstructions when the wirings 40 are used as external terminals. The wirings 40 are formed in a manner to extend over the end sections of the first resin layers 30 on the opposite side of the electrodes 14 and reach the top surface of the passivation film 16. In the example shown in FIG. 1A, the wirings 40 extend from the electrodes 14 disposed at the end sections of the semiconductor substrate 10 toward the central area thereof.

According to the present embodiment, the second resin layer 32 is formed in a manner to surround outside the first region 20 that overlaps the integrated circuit 12, such that generation of cracks can be prevented by the second resin layer 32 outside the integrated circuit 12.

Manufacturing Method

FIG. 3A-FIG. 4C are schematic cross-sectional views showing steps of a method for manufacturing a semiconductor device in accordance with the first embodiment of the invention. According to the present embodiment, a semiconductor substrate 10 (a semiconductor wafer) having a plurality of integrated circuits 12 formed at intervals and electrodes 14 electrically connected to the respective integrated circuits 12 is prepared. Its details are generally the same as those described above.

Figure 3B:
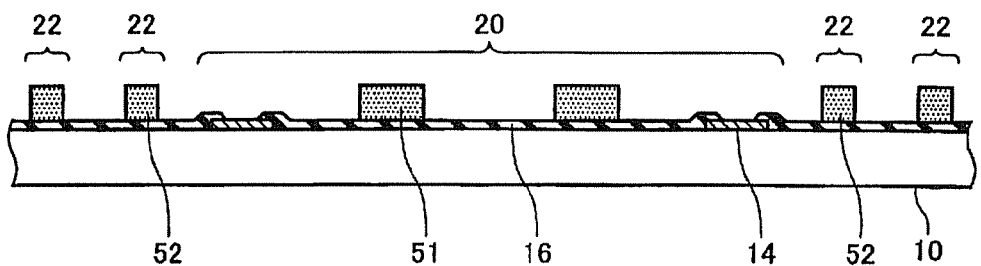

As shown in FIG. 3A, a thermosetting type resin precursor layer 50 is formed, and the layer is patterned as shown in FIG. 3B, thereby forming first and second resin precursor layers 51 and 52. The first and second resin precursor layers 51 and 52 are formed in the same height as they are concurrently formed from the one-piece resin precursor layer 50. However, the first and second resin precursor layers 51 and 52 are formed in a manner that the surface area per unit volume of the second resin precursor layer 52 is greater than that of the first resin precursor layer 51. If the angle of inclination of the side surfaces of the first and second resin precursor layers 51 and 52 is uniform (for example, vertical), the upper surface of the second resin precursor layer 52 is made smaller than the upper surface of the first resin precursor layer 51.

Figure 3C:
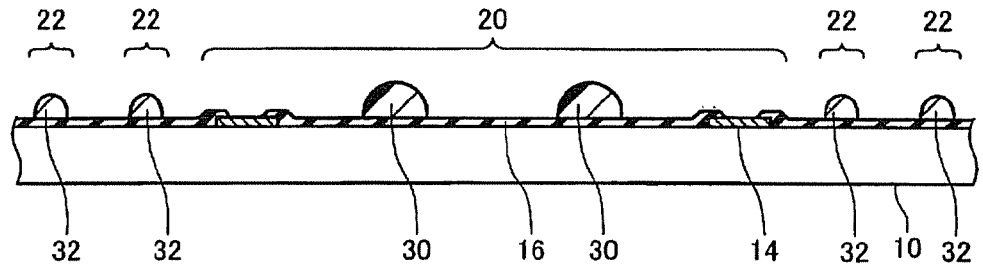

The first and second resin precursor layers 51 and 52 are heated, thereby forming first and second resin layers 30 and 32, as shown in FIG. 3C. Even though the first and second resin precursor layers 51 and 52 are heated at the same time, the amount of heat per unit volume of the second resin precursor layers 52 becomes greater because their surface area per unit volume is greater. As a result, the second resin precursor layers 52 have a higher degree of temporary softening before hardening, compared to the first resin precursor layers 51, and therefore become lower by their dead weight, whereby the height of the second resin layers 32 becomes lower than that of the first resin layers 30.

In this manner, the first resin layers 30 are formed in the plural first regions 20 that overlap the plural integrated circuits 12, respectively. Also, the second resin layers 32 are formed in the second regions 22 that surround outside the first regions, respectively, separated a distance from the first resin layers 30. In the example shown in FIG. 3C, a pair of the second resin layers 32 disposed in the adjacent second regions 22 are disposed, separated a distance from each other. Each set of the plural second regions 22 forms a rectangular frame configuration. As a modified example, a plurality of the second regions may form a lattice configuration. In the present embodiment, the second resin layers 32 (the second resin precursor layers 52) are formed in a manner to avoid cutting areas (not only scribe lines but also all areas that are cut by a dicer) for cutting the semiconductor substrate 10. Other details of the first and second regions 20 and 22 and the first and second resin layers 30 and 32 are generally the same as those described above.

Figure 4A:
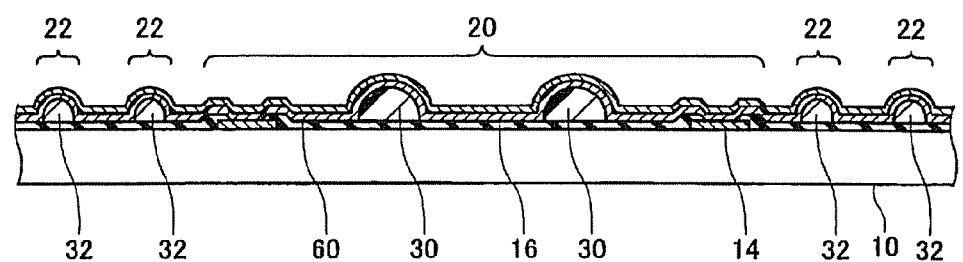
FIGS. 4A-4C are schematic cross-sectional views for describing the method for manufacturing a semiconductor device in accordance with the first embodiment of the invention.

As shown in FIG. 4A, a conductive film 60 is formed on the passivation film 16, electrodes 14 and the first and second resin layers 30 and 32. The film formation may be performed by sputtering. The conductive film 60 may be formed with a plurality of layers.

Figure 4B:
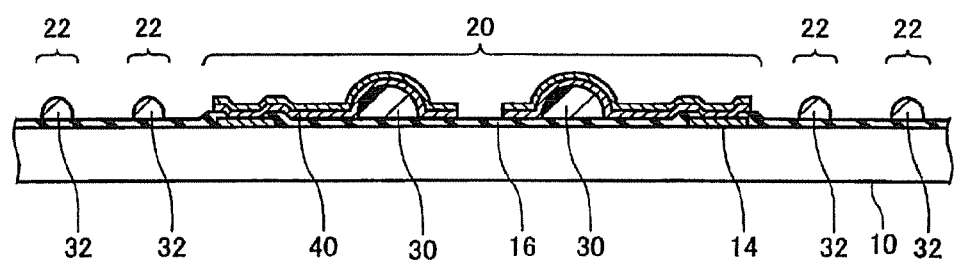

As shown in FIG. 4B, the conductive film 60 is patterned (etched), whereby wirings 40 electrically connected to the electrodes 14 are formed on the first resin layer 30. In the step of forming the wirings 40, a plurality of the wirings 40 at intervals are formed on each of the first resin layers 30 (see FIG. 1A). Details of the wirings are generally the same as those described above.

Portions of the first resin layers 30 between the plural wirings 40 (portions exposed through the wirings 40) may be etched (see FIG. 2). By this, the difference in height between the wirings 40 and the exposed surface of the first resin layers 30 becomes greater, which makes electrical connections easier. In this etching step, the second resin layers 32 may also be etched at the same time to make them lower.

Figure 4C:
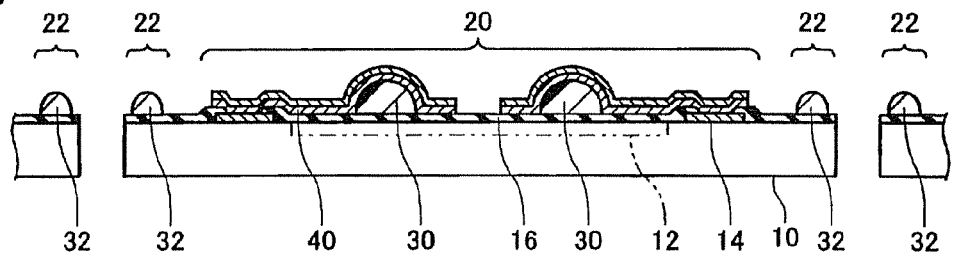

As shown in FIG. 4C, the semiconductor substrate 10 is cut. More specifically, the semiconductor substrate 10 (semiconductor wafer) is cut into a plurality of semiconductor chips in a manner that at least a portion of the second resin layer 32 remains to be attached to the outside of the first region 20 between adjacent ones of the first regions 20. By performing the step of cutting the semiconductor substrate 10 in a manner to avoid the second resin layers 32 (in particular, while keeping a distance from them), the remaining second resin layers 32 are disposed on the semiconductor substrate 10 at locations spaced a distance from the edges of the semiconductor substrate 10, as shown in FIG. 4C. As a modified example, the step of cutting the semiconductor substrate 10 may performed while cutting along the peripheral section of the second resin layers 32, the edge of the remaining second resin layers 32 is disposed aligned with the edge of the semiconductor substrate 10.

According to the present embodiment, the second resin layers 32 are formed in a manner to surround outside the region overlapping the integrated circuit 12, such that generation of cracks can be prevented by the second resin layers 32 outside the integrated circuit 12. Other details of the manufacturing method are obvious from the structure of the semiconductor device described above, and therefore their description is omitted.

Second Embodiment

Figure 5A:
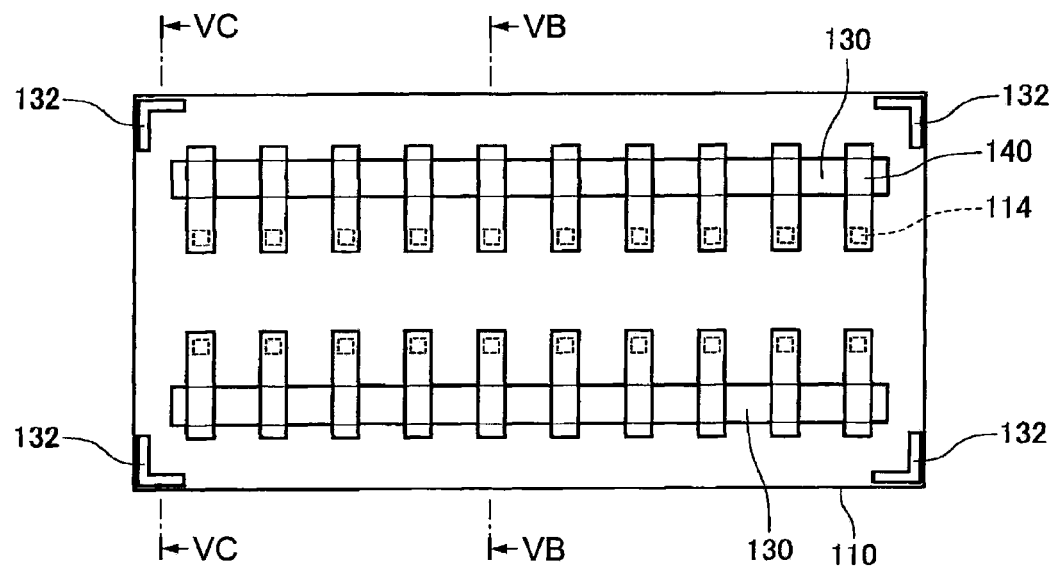
FIG. 5 is a plan view of a semiconductor device in accordance with a second embodiment of the invention.
Figure 5B:
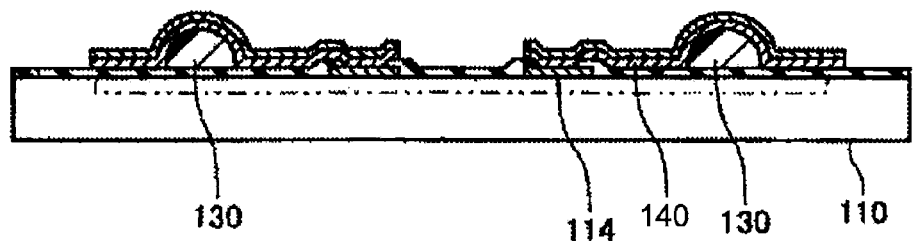
Figure 5C:
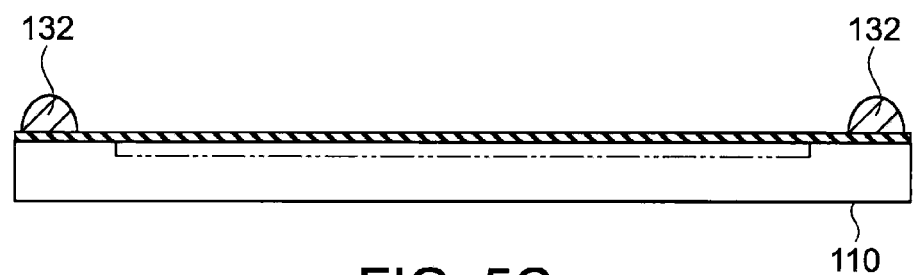

FIG. 5 is a plan view of a semiconductor device in accordance with a second embodiment of the invention. This embodiment is different from the first embodiment in that second resin layers 132 are disposed only at corner sections of a semiconductor substrate 110. More specifically, four of the second resin layers 132 are disposed at four corner sections of the rectangular semiconductor substrate 110, respectively. No second resin layer is formed between a pair of the second resin layers 132 located at two ends of each of the sides of the semiconductor substrate 110. Even with this configuration, the corner sections of the semiconductor substrate 110 are protected, and generation of cracks can be prevented.

In the present embodiment, electrodes 114 are formed in a central section of the semiconductor substrate 110, and first resin layers 130 are formed outside of the electrodes 114. Wirings 140 extend from the electrodes 114 disposed in the central section of the semiconductor substrate 110 toward the end section thereof. The arrangement of the electrodes 114, the first resin layers 130 and the wirings 140 may also be applicable to the first embodiment. Other details generally correspond to those of the semiconductor device and manufacturing method described above in the first embodiment.

Third Embodiment

Figure 6A:
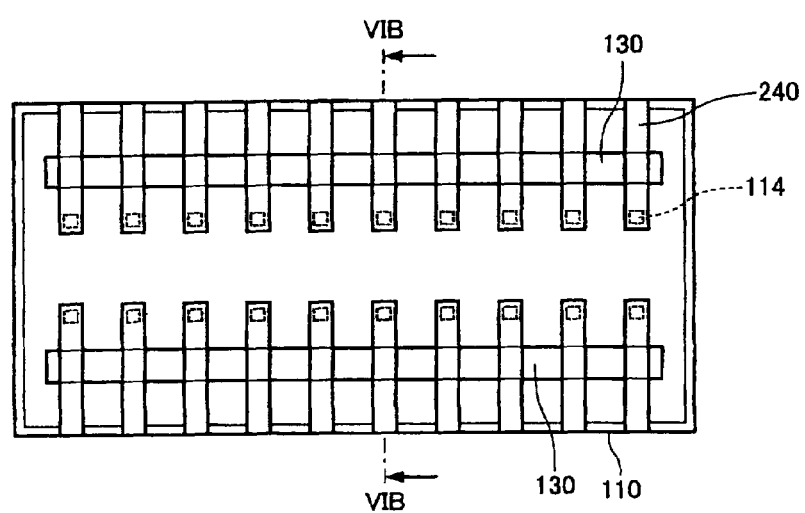
FIG. 6A is a plan view of a semiconductor device in accordance with a third embodiment of the invention.
Figure 6B:
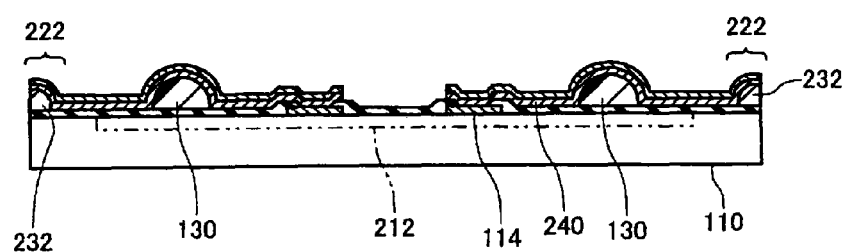
FIG. 6B is a cross-sectional view of the semiconductor device taken along lines VIB-VIB shown in FIG. 6A.

FIG. 6A is a plan view of a semiconductor device in accordance with a third embodiment of the invention, and FIG. 6B is a cross-sectional view of the semiconductor device taken along lines VIB-VIB shown in FIG. 6A. In the present embodiment, second resin layers 232 are disposed continuously (without being separated) in a second region 222. Therefore, the second resin layer 232 form a rectangular frame configuration. Also, wirings 240 are formed in a manner to extend from the electrodes 114, over the first resin layers 130, and reach the top surface of the second resin layer 232. With this structure, portions of the wirings 240 on the second resin layer 232 may be used as test pads, at which probes are abutted for performing a characteristic test.

According to the manufacturing method in accordance with the third embodiment, the step of cutting the semiconductor substrate 110 as a semiconductor wafer may be performed, while cutting a portion of the second resin layer 232. As a prerequisite condition, a portion of the second resin layer 232 is disposed on the cutting region (or scribe lines). The plurality of second resin layers 232 corresponding to the plurality of integrated circuits 212 may each be formed in a rectangular frame configuration. Alternatively, a resin layer in a lattice configuration may be formed, and its plural rectangular frame portions surrounding plural integrated circuits 212, respectively, may be defined as a plurality of second resin layers 232. In this case, as each pair of the second resin layers 232 located in adjacent ones of the second regions 222 are connected in one piece, the connecting section is cut in a manner to divide the pair of the second resin layers 232. In this embodiment, the second resin layer 232 is disposed in a manner that its edge is flush with the edge of the semiconductor substrate 110. Also, the wirings 240 are disposed in a manner that their edges are flush with the edge of the semiconductor substrate 110. The arrangement of the electrodes 114, the first resin layer 130 and the wirings 240 may also be applicable to the first embodiment. Other details generally correspond to those of the semiconductor device and its manufacturing method according to the first and second embodiments described above.

The invention is not limited to the embodiments described above, and many modifications can be made. For example, the invention may include compositions that are substantially the same as the compositions described in the embodiments (for example, a composition with the same function, method and result, or a composition with the same objects and result). Also, the invention includes compositions in which portions not essential in the compositions described in the embodiments are replaced with others. Also, the invention includes compositions that achieve the same functions and effects or achieve the same objects of those of the compositions described in the embodiments. Furthermore, the invention includes compositions that include publicly known technology added to the compositions described in the embodiments.

What is claimed is:

1. A semiconductor device comprising:
    a semiconductor substrate that has an integrated circuit and an electrode electrically connected to the integrated circuit;
    a first resin layer that is formed in a first region overlapping the integrated circuit over a surface of the semiconductor substrate where the electrode is formed;
    a wiring that is electrically connected to the electrode and is formed on the first resin layer; and
    a second resin layer that is formed on the surface of the semiconductor substrate in a second region surrounding the first region, the second resin layer being spaced a distance from the first resin layer, and being disposed continuously over the entire second region,
    wherein the wiring covers the first resin layer and the second resin layer.

2. The semiconductor device according to claim 1, wherein the second resin layer is formed lower than the first resin layer.

3. The semiconductor device according to claim 1, wherein the second resin layer is disposed in a manner to contact a periphery of the surface of the semiconductor substrate where the electrode is formed.

4. The semiconductor device according to claim 3, wherein the periphery of the surface of the semiconductor substrate where the electrode is formed is in a rectangular shape, and the second resin layer is disposed at least at corner sections of the rectangular shape.

5. The semiconductor device according to claim 1, wherein the wiring is formed such that the wiring extends from the electrode, over the first resin layer, and reaches the top surface of the second resin layer.

6. The semiconductor device according to claim 1, wherein the wiring entirely covers the first resin layer and the second resin layer when viewed in cross-section.

* * * * *